United States Patent
Zhong et al.

(10) Patent No.: US 10,854,451 B2
(45) Date of Patent: Dec. 1, 2020

(54) SUPERPLANARIZING SPIN-ON CARBON MATERIALS

(71) Applicant: Brewer Science Inc., Rolla, MO (US)

(72) Inventors: Xing-Fu Zhong, Rolla, MO (US); Runhui Huang, Rolla, MO (US); Boyu Zhang, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 456 days.

(21) Appl. No.: 15/188,620

(22) Filed: Jun. 21, 2016

(65) Prior Publication Data
US 2016/0372326 A1 Dec. 22, 2016

Related U.S. Application Data

(60) Provisional application No. 62/183,046, filed on Jun. 22, 2015.

(51) Int. Cl.
| | | |
|---|---|---|
| *H01L 21/033* | (2006.01) | |
| *H01L 21/02* | (2006.01) | |
| *C09D 125/08* | (2006.01) | |
| *C09D 131/02* | (2006.01) | |
| *C09D 179/08* | (2006.01) | |

(52) U.S. Cl.
CPC ........ *H01L 21/0337* (2013.01); *C09D 125/08* (2013.01); *C09D 131/02* (2013.01); *C09D 179/08* (2013.01); *H01L 21/02118* (2013.01); *H01L 21/02282* (2013.01)

(58) Field of Classification Search
CPC ........... H01L 21/0337; H01L 21/02118; H01L 21/02282; C09D 125/08; C09D 131/02; C09D 179/08
See application file for complete search history.

(56) References Cited

U.S. PATENT DOCUMENTS

| | | | |
|---|---|---|---|
| 7,226,721 B2 | 6/2007 | Takei et al. | |
| 7,348,281 B2 | 3/2008 | Brakensiek et al. | |
| 10,509,320 B2 | 12/2019 | Takei et al. | |
| 2008/0199789 A1 | 8/2008 | Abdallah et al. | |
| 2009/0035590 A1 | 2/2009 | Sullivan et al. | |
| 2011/0236837 A1 | 9/2011 | Fu et al. | |
| 2012/0034419 A1 | 2/2012 | Washburn et al. | |
| 2012/0325532 A1 | 12/2012 | Lin | |

(Continued)

FOREIGN PATENT DOCUMENTS

| | | |
|---|---|---|
| WO | 2005/013601 | 2/2005 |
| WO | 2006/077748 | 7/2006 |

OTHER PUBLICATIONS

International Search Report and Written Opinion dated Oct. 21, 2016 in corresponding PCT/US2016/038554 filed Jun. 21, 2016.

(Continued)

*Primary Examiner* — Robert S Walters, Jr.
(74) *Attorney, Agent, or Firm* — Hovey Williams LLP

(57) ABSTRACT

Planarizing and spin-on-carbon (SOC) compositions that fill vias and/or trenches on a substrate while planarizing the surface in a single thin layer coating process are provided. The compositions can planarize wide ranges of substrates with vias or trenches of from about 20 nm to about 220 nm wide, and up to about 700 nm deep. These extraordinary properties come from the low molecular weight of the polymers used in the materials, thermally-labile protecting groups on the polymers, and a delayed crosslinking reaction.

35 Claims, 4 Drawing Sheets

(56) References Cited

U.S. PATENT DOCUMENTS

2013/0280656 A1 10/2013 Lowes et al.

OTHER PUBLICATIONS

Madou, Marc J, "Manufacturing Techniques for Microfabrication and Nanotechnology," Third Edition Fundamentals of Microfabrication and Nanotechnology vol. II, CRC Press, Taylor & Francis Group, Jun. 13, 2011, pp. 72-73.
Office Action in corresponding Japanese Patent Appication No. 2017-562601, 16 pages.

SUPERPLANARIZING SPIN-ON CARBON MATERIALS

RELATED APPLICATION

The present application claims the priority benefit of U.S. Provisional Patent Application Ser. No. 62/183,046, filed Jun. 22, 2015, entitled SUPERPLANARIZING SPIN-ON CARBON MATERIALS, incorporated by reference in its entirety herein.

BACKGROUND OF THE INVENTION

Field of the Invention

The present invention broadly relates to compositions and methods for filling vias or trenches and planarizing photolithography structures.

Description of the Prior Art

Photolithography of semiconductor devices involves patterning multiple layers on top of each other. As each layer is deposited and patterned, depositing a uniform, planar layer of material on top of it becomes critical and increasingly difficult, especially with patterns with high aspect ratios or large trenches or vias. One method of planarizing these structures is to overcoat a large thickness of material over the structures in order to give a planar top surface. However, the large amount of material (and resulting overburden) is undesirable for further processing steps. Other planarizing materials and processes require multiple steps of reflow baking, chemical-mechanical polishing (CMP), or chemical develop-back, or plasma etch back to achieve planarization over these difficult structures without leaving an excess of planarization material on top of the structures.

Current commercial products have some limitations or issues, including photoresist poisoning and spin-bowl compatibility issues. The functional groups on the polymer in these compositions are often weakly basic and can poison the photoresist, causing footing or scumming. They can also react with acid groups from other materials used in the same spin bowl, resulting in gelation or precipitation of the materials, which will clog the spin bowl's piping system.

A further limitation of currently available products is the resulting high bias between open areas and dense vias or trenches areas. "Bias," and particularly "high bias," is depicted in Figure ("FIG.") 1. A planarizing layer 10 is deposited onto the surface 12 of a substrate 14. Surface 12 has topographical features formed therein. In this instance, those features are vias 16. The surface 12 has both an open area region 18 and a dense region 20. Differences in feature density result in open-dense bias, in which the depth or thickness of the planarizing layer is greater in open area device feature regions like region 18 than in dense device feature regions like region 20 (i.e., A>B, which is referred to as "positive bias"). This high bias is due to the fact that extra material is needed to fill the vias or trenches, and the viscous material caused by high molecular weight does not have sufficient time to flow from the open areas into the dense vias or trenches areas to fully compensate. This bias leads to the need for extra processing steps in order to avoid the device problems that can result due to overly high bias.

SUMMARY OF THE INVENTION

The present invention overcomes the problems of the prior art by providing a method of forming a planarizing layer. The method comprises forming an initial layer of a planarizing composition on a substrate surface. The substrate surface comprises openings formed therein, and the planarizing composition comprises a compound dispersed or dissolved in a solvent system, with the compound having protective groups and the initial layer having an initial positive bias. The layer is heated, during which the protective groups begin to be removed from the compound, and the compound crosslinks to form a final planarizing layer. The final planarizing layer has a final bias that is less than the initial bias and less than about 30 nm.

The invention further provides a method of forming a planarizing layer where the method comprises forming an initial layer of a planarizing composition on a substrate surface. The substrate surface comprises openings formed therein, and the planarizing composition comprises a polymer dispersed or dissolved in a solvent system. The polymer comprises recurring monomers (I) comprising protective groups, and the initial layer has an initial bias. The layer is heated, during which the protective groups begin to be removed from the recurring monomers (I), and a final planarizing layer having a final bias is formed. The final bias is less than the initial bias and less than about 30 nm.

The invention also provides a planarized structure comprising a substrate having a surface comprising openings formed therein, and a planarizing layer adjacent the substrate surface and uniformly deposited in the openings. The planarizing layer comprises crosslinked polymers comprising recurring monomers (I), with the polymers being crosslinked through respective hydroxy groups on the recurring monomers (I). The planarizing layer has a bias of less than about 30 nm and an average thickness of less than about 150 nm.

Finally, the invention also provides a composition comprising a polymer and a crosslinking agent dissolved or dispersed in a solvent system. The polymer comprises recurring monomers (I) and (II). Recurring monomers (I) comprise hydroxy groups protected by a protective group, with the recurring monomers (I) being selected from the group consisting of protected vinylphenols, protected phenols, protected cresols, protected vinyl alcohols, protected allyl alcohols, protected hydroxyalkyl acrylates, protected hydroxyalkyl methacrylates, protected acrylic acids, protected methacrylic acids, protected vinylbenzoic acid, and combinations of the foregoing. Recurring monomers (II) are selected from the group consisting of substituted and unsubstituted styrenes, alkylstyrenes, methyl methacrylates, alkyl acrylates, alkyl methacrylates, vinyl acetates, acrylonitriles, methacrylonitriles, 1,3-butadiene, isoprenes, 9-vinyl carbazole, and combinations of the foregoing.

DETAILED DESCRIPTION OF THE PREFERRED EMBODIMENTS

Figure 1:
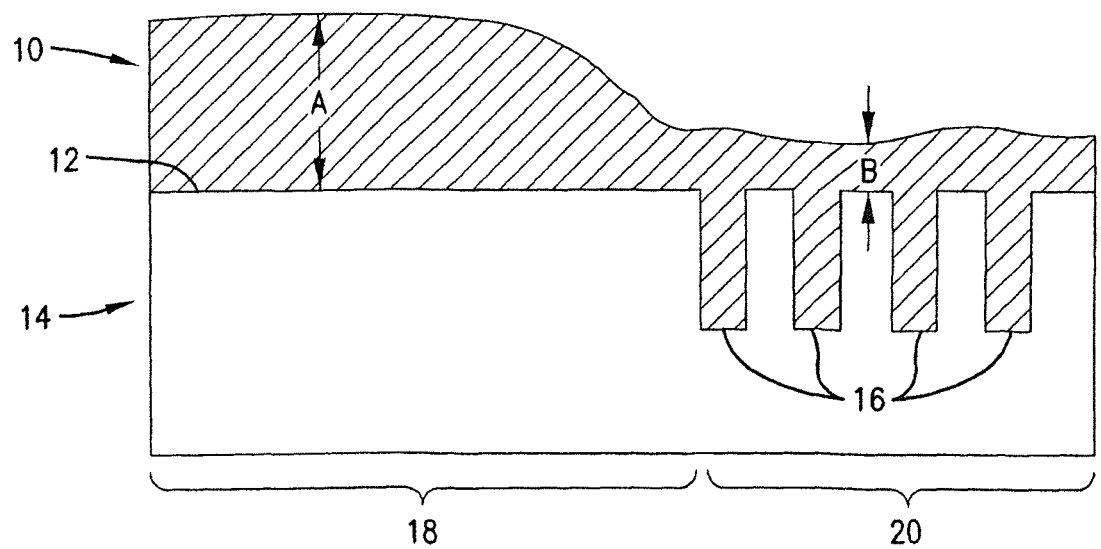
FIG. 1 is a cross-sectional view of a schematic depiction of the positive bias found in prior art planarizing compositions.

The present invention overcome the problems of the prior art by providing novel compositions and methods of using those compositions to form planarizing layers with zero and even a negative bias.

INVENTIVE COMPOSITIONS

1. Compounds

The compositions for use in the present invention comprise a compound dissolved or dispersed in a solvent system. The compound contains moieties (e.g., —OH groups, which includes —OH groups that are part of a carboxylic acid group) that have been protected by a protective group.

In one aspect, the compound is a polymer. The polymer preferably comprises recurring monomers (I), which include protected hydroxy or —OH groups. These groups can be part of alcoholic, phenolic, and/or carboxylic moieties present in the recurring monomer (I), with hydroxy groups that are part of phenolics being particularly preferred. "Protected" means that the hydroxy groups have been reacted with or contain a thermally decomposable protective group. (The "protected" hydroxy is not technically a hydroxy or —OH group because the hydrogen atom is not present until the protective group is removed.) This protective group is removed in the form of volatile gases during heat exposure ("deprotection"), thus returning a hydrogen atom to the previously-protected hydroxy or —OH group (i.e., it is now technically a true hydroxy or —OH group), leaving that group available for crosslinking at the desired time. Some preferred protective groups are those selected from the group consisting of

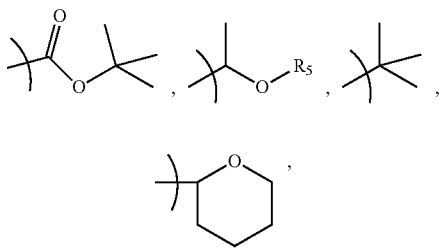

and combinations of the foregoing, where $R_5$ is selected from the group consisting of alkyls (preferably $C_1$-$C_8$, and more preferably $C_1$-$C_4$).

Preferred recurring monomers (I) having protective groups include those selected from the group consisting of protected vinylphenol, protected phenol, protected cresol, protected vinyl alcohol, protected allyl alcohol, protected hydroxyalkyl acrylate, protected hydroxyalkyl methacrylate, protected acrylic acid, protected methacrylic acid, protected vinylbenzoic acid, and combinations of the foregoing. Particularly preferred recurring monomers (I) are selected from the group consisting of p-tert-butoxycarbonyloxystyrene (TBSM), vinyl-tert-butyl carbonate, allyl-tert-butyl carbonate, p-tert-butoxycarbonyloxybenzene, p-tert-butoxycarbonyloxytoluene, 2-tert-butoxycarbonyloxyethyl acrylate, 2-tert-butoxycarbonyloxyethyl methacrylate, 3-tert-butoxycarbonyloxypropyl acrylate, 3-tert-butoxycarbonyloxypropyl methacrylate, tert-butyl acrylate, tert-butyl methacrylate, tert-butyl benzoate, and combinations of the foregoing. In a particularly preferred embodiment, the protective group is protecting a group (particularly a hydroxy group) that is present on an aromatic ring.

In one embodiment, the polymer further comprises recurring monomers (II). Recurring monomer (II) is preferably selected to tune the properties of the inventive compositions and/or of the planarizing layers formed from those compositions. Those properties include optical properties, such as the refractive index n ("n value") and the extinction coefficient k ("k value").

Recurring monomer (II) can be also used to tune rheological properties, such as the glass transition temperature, $T_g$, and/or the melt viscosity. Furthermore, recurring monomers (II) can be used to adjust surface properties such as surface energy and wettability to be compatible with substrates and top coatings, and the plasma etch rate of the polymer can be tuned by changing recurring monomer (II). Recurring monomer (II) is neutral, inert, and free of any functional groups that would participate in chemical reactions or hydrogen bonding during the material storage, coating, and baking. Preferred monomers for recurring monomer (II) include those selected from the group consisting of substituted (but not in a way that would negate the preceding sentence) and unsubstituted styrenes, alkyl (preferably $C_1$-$C_8$, and more preferably $C_1$-$C_4$) styrenes, methyl methacrylates, alkyl (preferably $C_1$-$C_8$, and more preferably $C_1$-$C_4$) acrylates, alkyl (preferably $C_1$-$C_8$, and more preferably $C_1$-$C_4$) methacrylates, vinyl acetates, acrylonitriles, methacrylonitriles, 1,3-butadiene, isoprenes, 9-vinyl carbazole, and combinations of the foregoing.

In another embodiment, the polymer comprises recurring monomers (III). Recurring monomers (III) comprise functional groups that can crosslink covalently with the deprotected groups from recurring monomer (I). Thus, the presence of recurring monomers (III) renders the polymer self-crosslinkable. Suitable recurring monomers (III) include those selected from the group consisting of glycidyl acrylate, glycidyl methacrylate, maleic anhydride, and combinations of the foregoing.

The polymer can include the following combinations of recurring monomers: (I) only; (I) and (II); (I) and (III); or (I), (II), and (III). The preferred monomer ratios in situations where the polymer is not a homopolymer are shown in Tables 1 and 2. One especially preferred polymer is a base copolymer of styrene (II) with p-tert-butoxycarbonyloxystyrene (I).

TABLE 1

| | Ratios When Copolymer | |
|---|---|---|
| RECURRING MONOMERS | BROAD RANGE | PREFERRED RANGE |
| (I):(II) | from about 1:9 to about 9:1 | from about 3:7 to about 7:3 |
| (I):(III) | from about 1:9 to about 9:1 | from about 3:7 to about 7:3 |

TABLE 2

Ratios When Terpolymer

| RECURRING MONOMERS | BROAD RANGE | PREFERRED RANGE |
|---|---|---|
| (I):(II) | from about 1:8 to about 8:1 | from about 2:6 to about 6:2 |
| (I):(III) | from about 1:8 to about 8:1 | from about 2:6 to about 6:2 |

The polymer (whether a homopolymer, copolymer, or terpolymer) can be synthesized by any number of methods, including free radical polymerization or reversible addition-fragmentation chain transfer (RAFT) polymerization. To achieve polymerization, the desired monomers are dispersed or dissolved in a solvent such as propylene glycol methyl ether acetate (PGMEA), propylene glycol methyl ether (PGME), propylene glycol n-propyl ether (PnP), ethyl acetoacetate (EAA), methyl isoamyl ketone (MIAK), methyl isobutyl carbinol (MIBC), cyclopentanone, cyclohexanone, ethyl lactate, and mixtures thereof. Suitable thermal initiators are then added to the mixture. Especially preferred thermal initiators are azo compounds such as 2,2'-azobis(2-methylpropionitrile) (AIBN or VAZO 64), 2,2'-azobis(2-methylbutyronitrile) (VAZO 67), 1,1'-azobis(cyclohexanecarbonitrile) (VAZO 88), 2,2'-azobis(2,4-dimethylvalero-nitrile) (VAZO 52), or peroxide compounds such as benzoyl peroxide (BPO) and dicumyl peroxide (DCP).

The polymers can be also synthesized by reacting —OH-containing homopolymers or copolymers with a reagent to protect —OH groups. For example, phenol-containing polymers such as poly(4-vinylphenol), phenol novolac resin, and cresol novolac cresol resin can be reacted with di-tert-butyl dicarbonate, so that the phenolic —OH groups are protected with tert-butyloxycarbonyl (t-BOC) groups.

In another embodiment, the polymer is a polyimide having —OH groups that have been protected as noted above. One preferred such polyimide is the polyimide formed when 4,4'-(9-fluorenylidene)dianiline is polymerized with 3-hydroxy-1,8-naphthalic anhydride. Another preferred such polyimide is the one resulting from the polymerization of 4,4'-(4,4'-isopropylidenediphenoxy)bis(phthalic anhydride) with 2-amino-3-hydroxyanthraquinone. Exemplary protective groups are the same as those discussed above.

The polymer preferably has a low molecular weight. That is, the weight average molecular weight of the polymer is preferably less than about 8,000 Daltons, more preferably less than about 6,000 Daltons, and even more preferably from about 2,000 to about 6,000 Daltons. The desired molecular weight can be achieved by using optimized combinations of initiator types, initiator concentrations, monomer concentrations, chain transfer agent types, chain transfer agent concentrations, solvents, and polymerization temperatures. The polymers may be characterized by gel permeation chromatography (GPC) in THF, using monodisperse polystyrenes as the standards. Furthermore, the term "polymer" includes oligomers as well, provided those oligomers otherwise possess the characteristics described above. However, in preferred embodiments, "polymer" does not include oligomers.

In another embodiment, the compound comprises a small molecule rather than a polymer or oligomer. The small molecule would still include the protective groups as described above, with the protective groups preferably protecting hydroxy groups (and preferably those present on an aromatic ring and/or as part of a carboxylic acid on an aromatic ring), again as described above. Furthermore, the small molecule would still undergo the same protection/deprotection/crosslinking mechanisms described herein. Some preferred such small molecules have the following structure:

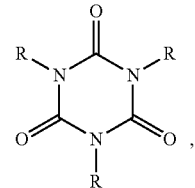

where each R is individually selected from the group consisting of:

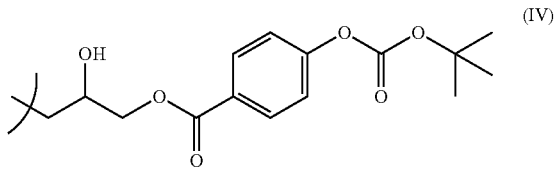

and

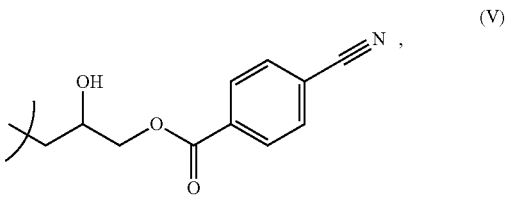

where at least one R is (IV), and preferably at least two R groups are (IV). In a particularly preferred small molecule embodiment, all R groups are (IV).

Preferred small molecules include cyanurates, such as those formed by reacting a compound comprising a protected hydroxy group (e.g., di-tert-butyl dicarbonate) with a cyanurate or isocyanurate (e.g., 3,7-dihydroxy-2-naphthoic acid-grafted 1,3,5-tris(2,3,-epoxypropyl)isocyanurate, 4-hydroxybenzoic acid- and 4-cyanobenzoic acid-grafted tris(2,3-epoxypropyl)isocyanurate) and optionally pyridine.

2. Solvent System

Preferred solvent systems include a solvent selected from the group consisting of PGMEA, PGME, PnP, EAA, MIAK, MIBC, cyclopentanone, cyclohexanone, ethyl lactate, and mixtures thereof. The solvent system should have a boiling point of from about 50° C. to about 250° C., and more preferably from about 150° C. to about 200° C.

3. Other Ingredients

In another embodiment, a separate crosslinking agent may be included. In polymeric embodiments, this could be in addition to recurring monomer (III), but is more likely to be in instances where the polymer does not include recurring monomer (III). In small molecule embodiments, the separate crosslinking agent will typically be needed.

The crosslinking agent should be one that is capable of crosslinking with the deprotected hydroxy groups, thus preventing the final planarizing layer from solvent stripping in processes where it will be top-coated with other layers. Suitable crosslinking agents include those selected from the group consisting of epoxy, melamine, and vinyl ether crosslinkers, such as MY721 (N,N,N',N'-tetraglycidyl-4,4'-methylene-bisbenzenamine), Cymel® 303 (hexamethoxymethylmelamine), Powderlink™ 1174 [1,3,4,6-tetrakis-(methoxymethyl)glycoluril], ECN 1299 (epoxy cresol novolac resin), and Epon SU-8. In embodiments where a separate crosslinking agent is utilized, it is preferably included at levels of from about 5% to about 40% by weight, and preferably from about 10% to about 30% by weight, based upon the total weight of the polymer or small molecule taken as 100% by weight.

It will be appreciated that a number of other optional ingredients can be included in the compositions as well. Typical optional ingredients include those selected from the group consisting of surfactants and adhesion promoters.

A catalyst can also be included to initiate crosslinking reactions, if necessary. Suitable catalysts include acids or bases, and include those selected from the group consisting of p-toluenesulfonic acid (pTSA), 5-sulfosalicylic acid (5-SSA), triphenylphosphine, bis(triphenylphosphoranylidene) ammonium chloride, tetrabutylphosphonium bromide, and ethyltriphenylphosphonium acetate, benzyltriethylammonium chloride (BTEAC), and tetramethylammonium hydroxide (TMAH). In embodiments where a catalyst is utilized, it is preferably included at levels of from about 0.5% to about 5% by weight, and preferably from about 1% to about 3% by weight, based upon the total weight of the polymer or small molecule taken as 100% by weight.

4. Forming the Compositions

Regardless of the embodiment, the compositions are formed by simply dispersing or dissolving the compound (be it a polymer or a small molecule) and any other ingredients as described above, in the solvent system, preferably at ambient conditions and for a sufficient amount of time to form a substantially homogeneous dispersion. The solvent system should be utilized at a level of from about 70% to about 99% by weight, more preferably from about 80% to about 98% by weight, and even more preferably from about 90% to about 96% by weight, based upon the total weight of the composition taken as 100% by weight. Thus, the percent solids in the composition will be from about 1% to about 30% by weight, more preferably from about 2% to about 20% by weight, and even more preferably from about 4% to about 10% by weight, based upon the total weight of the composition taken as 100% by weight. The compound should be present in the composition at a level of from about 50% to about 100% by weight, more preferably from about 60% to about 100% by weight, and even more preferably from about 70% to about 100% by weight, based upon the total weight of solids in the composition taken as 100% by weight. In instances where other ingredients are included, as discussed previously, the maximum compound level of 100% set forth in the foregoing ranges will be reduced by the weight % of those other ingredients.

In some embodiments, the planarizing layer formed is a high-carbon content layer. In these instances, the compound should be provided at sufficient levels so that the carbon levels in the composition are at least about 65% carbon atoms, preferably at least about 70% carbon atoms, and even more preferably from about 70% to about 80% carbon atoms, based upon the total number of atoms in all the solids in the composition taken as 100%. One having ordinary skill in the art can readily calculate this percentage based upon the chemical structure of the solids included in the composition. Alternatively, the carbon atom and total atom contents can be analyzed and calculated using known analytical equipment, including x-ray fluorescence spectroscopy, auger spectroscopy, and secondary ion mass spectroscopy.

INVENTIVE METHODS

Figure 2:
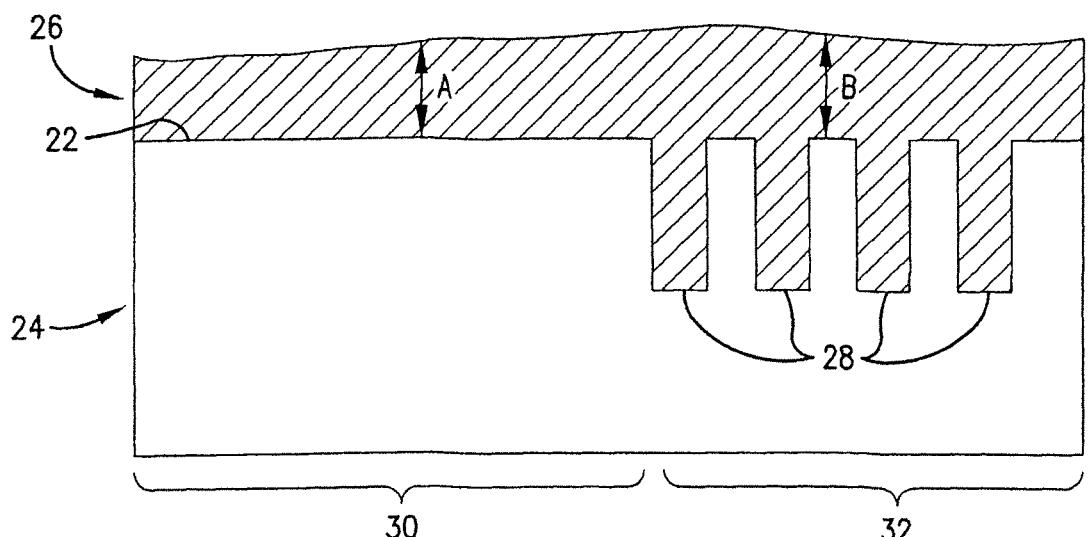
FIG. 2 is a cross-sectional view of a schematic depiction of a zero bias layer achieved according to the present invention.
Figure 3:
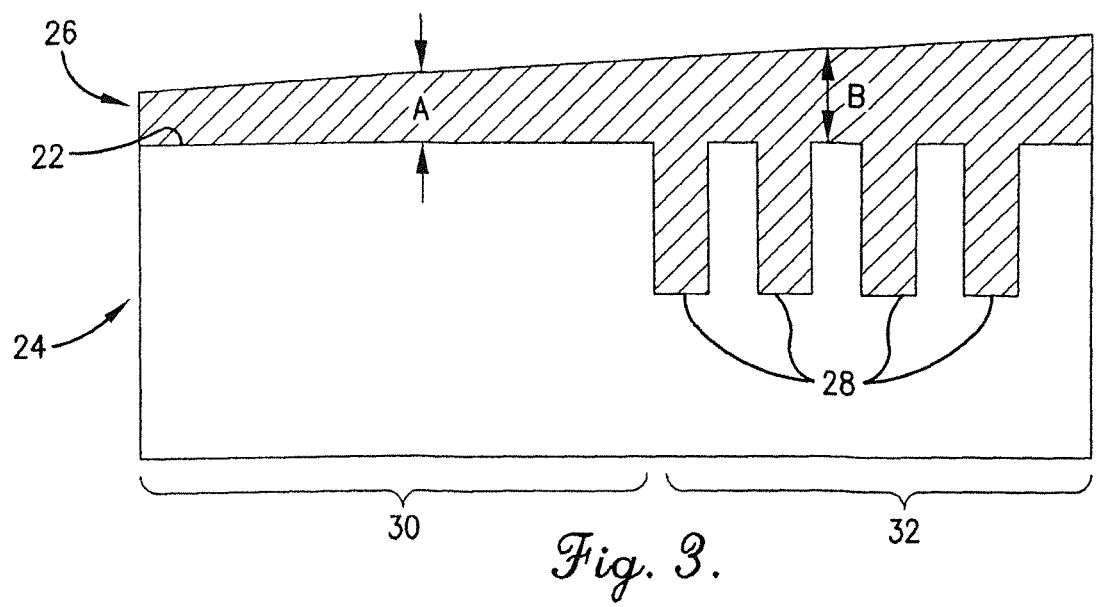
FIG. 3 is a cross-sectional view of a schematic depiction of a negative bias layer achieved according to the present invention.

Referring to FIGS. 2 and 3, the inventive methods comprise applying (e.g., by spin-coating) a composition according to the invention to the surface 22 of a substrate 24, so as to form a layer 26 of that composition on the substrate surface 22. The substrate utilized will preferably include topography 28 (e.g., contact holes, via holes, raised features and/or trenches). This topography can be included directly on the substrate surface 22, or it can be included in one or more layers of other material (not shown) formed on the substrate surface 22. As schematically depicted in FIGS. 2 and 3, the surface 22 has both an open area region 30 and a dense region 32.

The substrate 24 can be any microelectronic substrate. Preferred substrates 24 include those commonly used in front end and back end applications, such as FinFET (i.e., high aspect ratio structures) and dual damascene structures. Particularly preferred substrates 24 are selected from the group consisting of silicon, aluminum, tungsten, tungsten silicide, gallium arsenide, germanium, tantalum, tantalum nitride, silicon germanium, silicon dioxide, silicon nitride, aluminum oxide, glass, quartz, and low-k dielectrics.

The inventive composition can be applied to the substrate 24 at any number of average thicknesses depending upon the final use, but will typically be initially applied at thicknesses of from about 100 nm to about 500 nm. It is preferred that the composition be applied to the substrate in sufficient quantities to substantially planarize the substrate surface 22. After application and prior to baking, the composition layer 26 has an initial bias that is typically positive. It will be appreciated that the thickness required to planarize the substrate surface 22 will be less than that of previous planarizing materials. The composition layer 26 is then baked, during which time the composition forming layer 26 will flow from open areas like open area region 30 into the vias or trenches, especially in dense areas like dense region 32, and will do so much more quickly than prior art compositions.

The composition layer 26 is then heated, causing several chemical changes to take place in the layer 26, while it also physically flows into the vias 28 and any other openings that might be present in the substrate 24. During this baking, the protective groups described previously begin to be released in the farm of gases, with the groups to which they were bonded on recurring monomers (I) being converted to —OH groups (i.e., "deprotection" begins to occur). This process changes the polarity of the compound (the recurring monomers (I), in instance of a polymer being utilized). That is, the compound has an initial polarity, and during this process, the polarity shifts to become more polar. Thus, after heating, the compound has a second polarity that is more polar than the initial polarity.

Additionally, the surface tension of the composition layer 26 begins to change, creating a surface tension gradient that further effects the flow of the material towards, or towards and onto, vias/trenches/openings 28 that are present in the substrate surface 22. This change in surface tension can be observed by observing the change in the contact angle of the layer 26 over baking time. That is, the contact angle of the layer will change (decrease) by about 3% to about 15%, and more preferably from about 5% to about 10% after about 20 seconds of baking at the noted bake temperatures, and by about 4% to about 20%, and more preferably from about 6% to about 12% after about 60 seconds of baking at those temperatures.

Because of the deprotection that takes place during this process, the —OH groups that are generated or reformed after protective group removal are now available to crosslink with any recurring monomer (III) (in the instance of a polymer being utilized as the compound) and/or crosslinking agent that was utilized. Advantageously, however, the crosslinking reaction takes some time to commence after deprotection has commenced, thus allowing more time for the composition to flow from open area region 30 and be driven into the vias or trenches of dense regions 32 than was the case with prior art planarization materials. More particularly, it is preferred that crosslinking doesn't commence for at least about 5 seconds, preferably from about 10 seconds to about 50 seconds, and even more preferably from about 15 seconds to about 45 seconds after protective group removal commences. All of these chemical changes result in complete filling of openings that are from about 20 nm to about 220 nm wide, and up to about 700 nm deep.

The baking temperatures and times affect the degree of deprotection and subsequent crosslinking. It is preferred that the degree of deprotection after baking be at least about 50% complete, preferably from about 60% to about 95% complete, and more preferably from about 70% to about 90% complete. This is generally accomplished by heating at a temperature of from about 120° C. to about 260° C., and preferably from about 200° C. to about 260° C., for a time period of at least about 30 seconds, preferably from about 30 seconds to about 300 seconds, and more preferably from about 30 seconds to about 120 seconds. The degree of deprotection can be measured by FTIR, by determining contact angles, or film weight loss. In a preferred method, a layer of the composition is subjected to thermal gravimetric analysis ("TGA"), and the percent weight loss is measured over increasing temperature. The first weight loss/drop observed before leveling off is used to stoichiometrically calculate the % of deprotection.

Additionally and as noted above, in preferred embodiments the layer 26 will crosslink during this heating to form a crosslinked layer having an average thickness of from about 10 nm to about 500 nm, and preferably from about 20 nm to about 200 nm. As used herein, the average thickness of a layer (except for when determining bias) is determined by measuring with an ellipsometer. These measurements are repeated over a wafer (or other area as defined herein) five times, and the measurements are averaged to determine the average thickness of a layer.

The crosslinked layer 26 will be substantially insoluble in typical photoresist solvents, such as ethyl lactate, PGME, or PGMEA. Thus, when subjected to a stripping test, the non-covalently crosslinked layer will have a percent stripping of less than about 5%, preferably less than about 1%, and even more preferably about 0%. The stripping test involves first determining the thickness (by taking the average of measurements at five different locations) of the non-covalently crosslinked layer. This is the initial average film thickness. Next, a photoresist solvent is puddled onto the cured film for about 60 seconds, followed by spin drying at about 1,500 rpm for about 30 seconds to remove the solvent. The thickness is measured again at five different points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

It will be appreciated that the inventive methods can be used to form structures possessing properties not previously achieved. For example, the structures prepared according to the inventive methods will have low biases, including biases of zero or negative, even with very thin layers of the composition. Specifically, the inventive methods will result in layers having biases of less than about 50 nm, preferably less than about 30 nm, and more preferably from about 0 nm to about 20 nm, even at average film thicknesses of less than about 150 nm. Furthermore, at those same thickness, in some embodiments a bias of less than about 30, preferably less than about 10, more preferably less than about zero and even more preferably from about −30 nm to about 0 nm, or from about −30 nm to about −10 nm will be achieved.

The average thickness of a layer when determining bias is found by measuring (with an SEM photograph and imaging program (ImageJ)) the thickness of a layer at a point about halfway between two via holes that are not separated from one another by an intervening feature and whose boundaries are within about 1,000 nm of one another. These measurements are repeated over a wafer (or other area as defined herein) up to 49 times, and the measurements are averaged to determine the average thickness of a layer.

The bias is then calculated by subtracting the average thickness of a layer over a dense region ("B" in FIGS. 2 and 3) from the average thickness of that same layer over an open area region ("A" in FIGS. 2 and 3). A dense region is defined as a portion of a substrate that has at least about 50% of its surface area filled with via holes or a 1:1 line to space ratio, while an open area region is defined as a portion of a substrate that has less than about 20% of its surface area filled with via holes or a 1:5 line to space ratio.

Regardless of the embodiment, the crosslinked layers 26 formed according to the invention preferably have an n value (i.e., real component of the complex index of refraction) of from about 1.2 to about 2.0, preferably from about 1.5 to about 1.9, and even more preferably about 1.78, and a k value (i.e., imaginary component of the complex index of refraction) of from about 0 to about 1, preferably from about 0.1 to about 0.9, and even more preferably about 0.85.

Significantly, all of the foregoing can be achieved with a single coating step followed by a single bake step. That is, there is no need for additional coating or baking steps that are often carried out in prior art processes, or the use of multiple planarizing layers as has also been used in prior art processes. Furthermore, there is no need for additional develop-back or CMP steps that have been required in prior art processes. Thus, these additional steps/processes are preferably avoided, resulting in a less expensive and greatly simplified planarizing process.

A photoresist layer can then be applied to the planarizing layer directly, with the photoresist layer being patterned according to conventional processes (e.g., exposure to actinic radiation at the wavelength of interest and developing the exposed photoresist). Alternatively, this material can be used as an underlayer (SOC) material in a trilayer lithography process, with a silicon hardmask as the middle layer and a photoresist as the top layer.

Finally, in one embodiment, the crosslinked layer 26 is preferably non-photosensitive (i.e., a pattern cannot be defined in the layer when it is exposed to about 1 J/cm$^2$). Thus, the composition used to form the layer will be substantially free of photoacid generators (PAGs). "Substantially free" means that the compositions include less than about 0.1% by weight, preferably less than about 0.05%, and preferably about 0% by weight, based upon the total weight of the composition taken as 100% by weight. It's also substantially free of other agents capable of initiating polymerization or crosslinking upon light exposure.

It will be appreciated that a significant advantage of this invention is that it allows for the "tunability" of the final layers, depending upon the end user's needs. For example, the bias achieved can be adjusted depending upon the particular process needs. If the bias is negative, and an end user needs the bias to be zero, the degree of protection can be decreased to alter the bias to zero. Conversely, a positive bias can be decreased, and even changed to a negative bias, if desired, by increasing the degree of protection within the starting compound.

It is noted that FIGS. 2 and 3 are cross-sectional, schematic depictions and are not to scale. Additionally, the distance between the open and dense regions would be greater than depicted in the drawings. The topography found in the surface of a substrate subjected to planarizing processes varies greatly, depending upon the desired final use. Finally, although the foregoing describes the layer 26 as being applied directly to the substrate surface 22, it will be appreciated that in some instances, another layer of material (e.g., photoresists, hard masks) might be included between the substrate surface 22 and the planarizing layer 26.

EXAMPLES

The following examples set forth preferred methods in accordance with the invention. It is to be understood, however, that these examples are provided by way of illustration and nothing therein should be taken as a limitation upon the overall scope of the invention.

Example 1

Copolymer Synthesis in PGME

A solution was made by dissolving 35.510 grams of styrene (Sigma Aldrich, St. Louis, Mo.), 75.104 grams of p-tert-butoxy-carbonyloxystyrene (TBSM) (Heraeus, Vandalia, Ohio), 13.363 grams of 1-dodecanethiol (Sigma Aldrich, St. Louis, Mo.), and 6.324 grams of 2,2'-azobis(2-methylpropionitrile) (AIBN) (Arkalon Chemical Technologies, LLC, Meriden, Conn.) in 270.37 grams of PGME (KMG Electronic Materials, Inc., Houston, Tex.). The solution was heated at 70° C. under nitrogen with mechanical stirring. The polymerization was allowed to proceed at 70° C. for 12 hours. % solid content was 30.8%. GPC showed that the copolymer had a weight average molecular weight Mw of 5870 Daltons and a number average molecular weight Mn of 1350 Daltons. The copolymer structure is shown below.

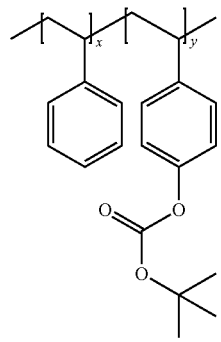

Example 2

Coating Formulation

In this procedure, 29.302 grams of the copolymer solution synthesized in Example 1 was mixed with 6.032 grams of MY721 (N,N,N',N'-tetraglycidyl-4,4'-methylenebisbenzenamine) solution (50% in PGME) (KMG Electronic Materials, Inc., Houston, Tex.). The mixture was dissolved in 34.776 grams of PGME and 30.000 grams of PGMEA (Ultra Pure Solutions, Inc., Castroville, Calif.). The solution was filtered through a 0.1-μm PTFE membrane filter.

Example 3

Via-Filling Test

Figure 4:
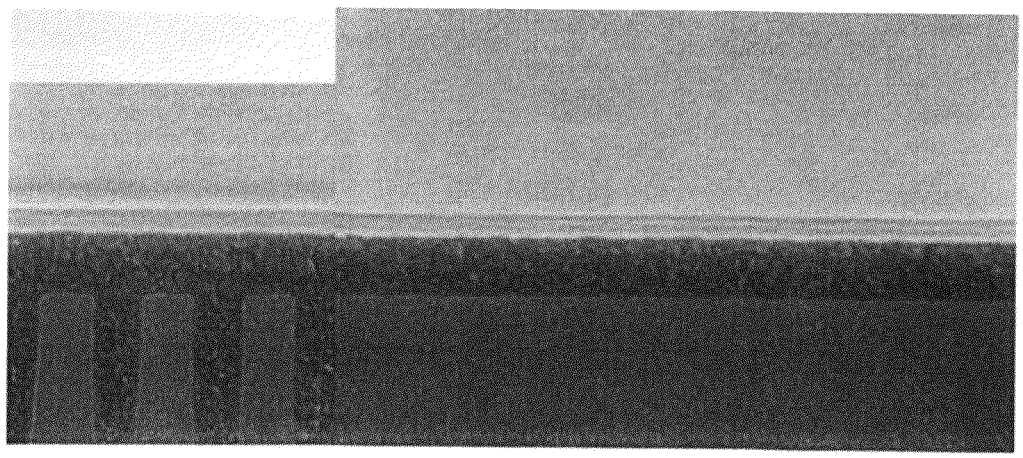
FIG. 4 is a scanning electron microscope ("SEM") photograph (100,000×) showing the negative bias achieved by the inventive planarizing composition and method of Examples 1-3.
Figure 5:
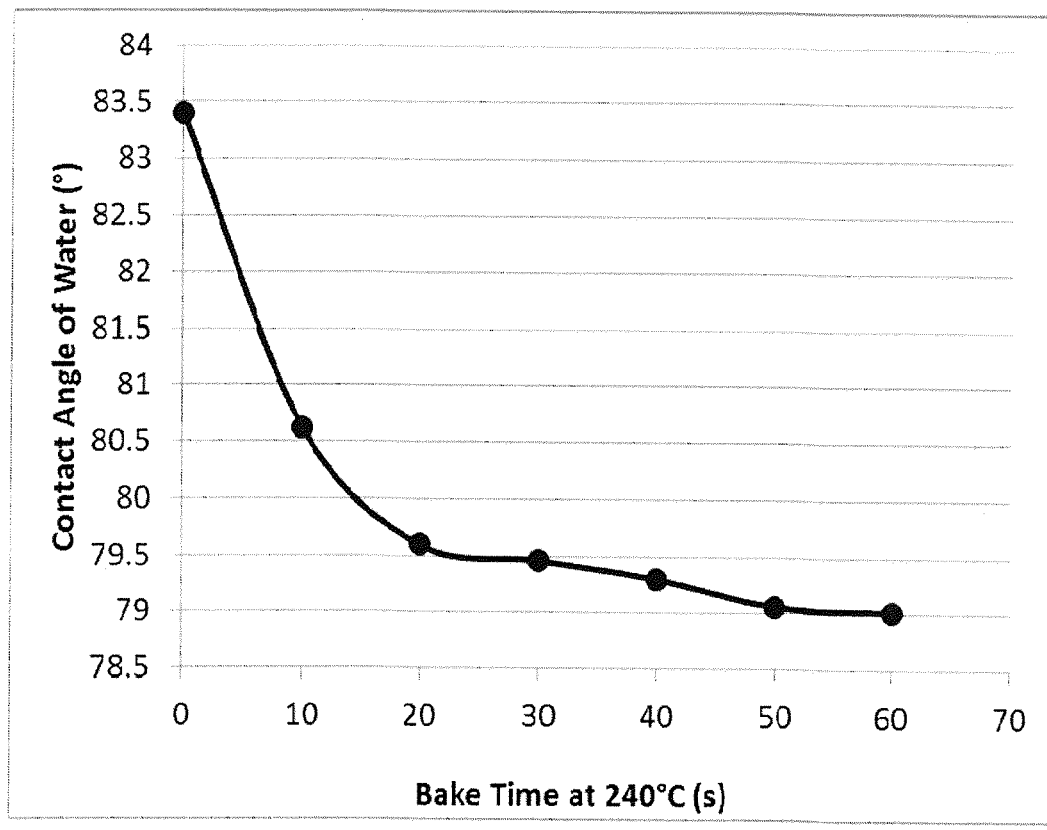
FIG. 5 is a graph showing the change in contact angle with bake time during the method carried out in Example 3.

The solution in Example 2 was spin-coated at 1,500 rpm for 60 seconds on chips containing vias that were 220 nm wide and 700 nm deep. The chips were baked at 240° C. for 60 seconds. The chips were examined by SEM. The results showed that the vias were completely filled with slightly negative bias (~5 nm) between open areas and dense vias areas (FIG. 4). The contact angle was also measured during baking, and the change (decrease) in contact angle over baking time is shown in FIG. 5.

Comparative Example 1

Coating Formulation

In this Example, 4.00 grams of mother liquor solution as prepared in Example 1 of U.S. Patent Application No. 2009/0035590 A1 (copolymer of 4-vinylpyridine with TBSM, Mw of about 30,000), incorporated by reference herein, was dissolved in 3.07 grams of PGME and 2.93 grams of PGMEA. The solution was filtered through 0.1-μm PTFE membrane filter.

Comparative Example 2

Via-Filling Test

Figure 6:
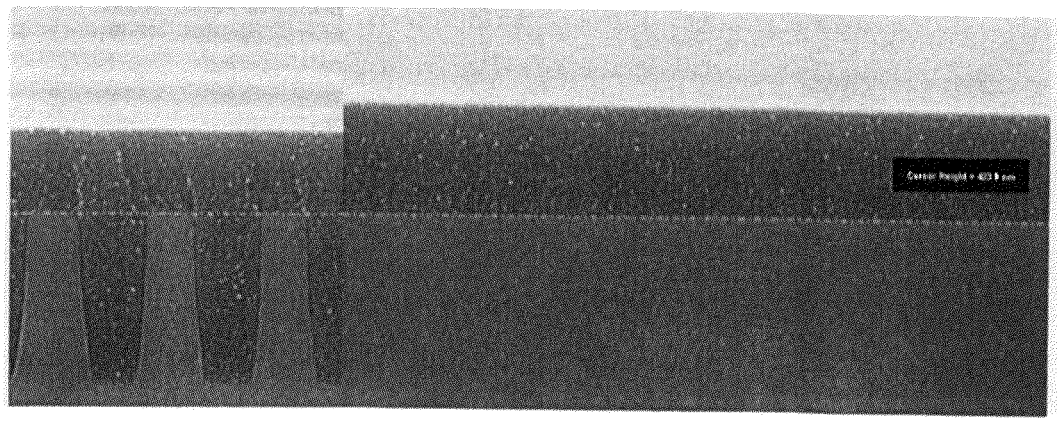
FIG. 6 is an SEM photograph (100,000×) showing a prior art planarizing composition, where a positive bias was achieved.

The solution from Comparative Example 1 was spin-coated at 1,500 rpm for 60 seconds on chips containing vias of 220 nm wide and 700 nm deep. The chips were baked at 205° C. for 60 seconds. The chips were examined by SEM. The results showed that the vias were completely filled with a high bias (108 nm) between open areas and dense vias areas (FIG. 6).

Example 4

Coating Formulation

In this Example, 66.75 grams of the copolymer solution synthesized in Example 1 was mixed with 13.76 grams of MY721 solution (50% in PGME). The mixture was dissolved in 277.82 grams of PGME and 141.77 grams of PGMEA. The solution was filtered through 0.1-µm PTFE membrane filter.

Example 5

Trench-Filling Test

Figure 7:
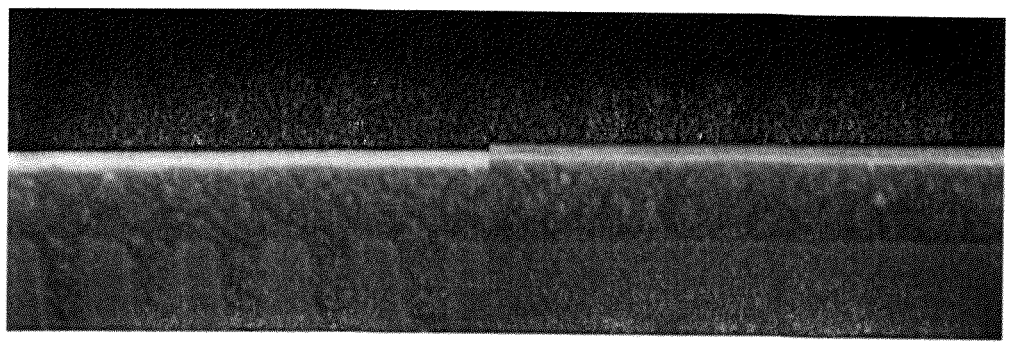
FIG. 7 is an SEM photograph (200,000×) showing the bias achieved by the inventive planarizing composition and method of Examples 4-5.

The solution in Example 4 was spin-coated at 1,500 rpm for 60 seconds on chips containing trenches of 60 nm wide and 200 nm deep. The chips were baked at 240° C. for 60 seconds. The chips were examined by SEM. The results showed that the trenches were completely filled with a slightly positive bias (10 nm) between open areas and dense trenches areas (FIG. 7).

Example 6

Trench-Filling Test

The solution in Example 4 was spin-coated at 1,500 rpm for 60 seconds on chips containing trenches that were 20 nm wide and 200 nm deep. The chips were baked at 240° C. for 60 seconds. The chips were examined by SEM. The results showed that the trenches were completely filled with slightly positive bias (18 nm) between open areas and dense trenches areas.

Example 7

Copolymer Synthesis in PGMEA

A solution was made by dissolving 38.504 grams of styrene, 81.516 grams of p-tert-butoxy-carbonyloxystyrene (Heraeus, Vandalia, Ohio) and 18.015 grams of 2,2'-azobis(2-methylpropionitrile) (AIBN) in 262.0 grams of PGMEA. The solution was heated at 75° C. under nitrogen with mechanical stirring. The polymerization was allowed to proceed at 75° C. for 12 hours and then 100° C. for 1 hour. % solids content was 35.7%. GPC showed that the copolymer had a weight average molecular weight Mw of 5914 Daltons, and a number average molecular weight Mn of 2694 Daltons.

Example 8

Coating Formulation

In this procedure, 5.034 grams of the copolymer solution synthesized in Example 7 was mixed with 1.185 grams of MY721 (N,N,N',N'-tetraglycidyl-4,4'-methylenebisbenzenamine) solution (50% in PGME). The mixture was dissolved in 13.756 grams of PGMEA. The solution was filtered through 0.1-µm PTFE membrane filter.

Example 9

Via-Filling Test

The solution from Example 8 was spin-coated at 1,500 rpm for 60 seconds on chips containing vias of 220 nm wide and 700 nm deep. The chips were baked at 240° C. for 60 seconds. The chips were examined by SEM. The results showed that the vias were completely filled with slightly positive bias (8 nm) between open areas and dense vias areas.

Comparative Example 3

Copolymer Synthesis in PGMEA

A solution was made by dissolving 38.504 grams of styrene, 81.521 grams of p-tert-butoxy-carbonyloxystyrene and 12.085 grams of 2,2'-azobis(2-methylbutyronitrile) in 268.80 grams of PGMEA. The solution was heated at 78° C. under nitrogen with mechanical stirring. The polymerization was allowed to proceed at 78° C. for 12 hours, and then 100° C. for 2 hours. % solids content was found to be 37.8%. GPC showed that it had a weight average molecular weight Mw of 9359 Daltons, and a number average molecular weight Mn of 4237 Daltons.

Comparative Example 4

Coating Formulation

In this Example, 4.762 grams of the copolymer solution synthesized in Comparative Example 3 were mixed with 1.210 grams of MY721 (N,N,N',N'-tetraglycidyl-4,4'-methylenebisbenzenamine) solution (50% in PGME). The mixture was dissolved in 14.043 grams of PGMEA. The solution was filtered through 0.1-µm PTFE membrane filter.

Comparative Example 5

Via-Filling Test

The solution in Comparative Example 4 was spin-coated at 1,500 rpm for 60 seconds on chips containing vias of 220 nm wide and 700 nm deep. The chips were baked at 240° C. for 60 seconds. The chips were examined by SEM. The results showed that the vias were completely filled with a high positive bias (112 nm) between open areas and dense vias areas.

Example 10

Copolymer Synthesis in PGMEA

A solution was made by dissolving 42.601 grams of glycidyl methacrylate, 66.224 grams of p-tert-butoxy-carbonyloxystyrene (Heraeus, Vandalia, Ohio), 2.163 grams of 2,2'-azobis(2,4-dimethylvaleronitrile) (VAZO 52), 1.038 grams of 1-dodecanethiol, and 6.371 grams of tert-dodecyl-mercaptan in 242.22 grams of PGMEA. The solution was heated at 52° C. under nitrogen with mechanical stirring. The polymerization was allowed to proceed at 52° C. for 48 hours. The % solids was 32.7%. GPC showed that the copolymer had a weight average molecular weight Mw of 6117 Daltons, and a number average molecular weight Mn of 3308 Daltons.

Example 11

Coating Formulation

In this Example, 3.680 grams of the copolymer solution synthesized in Example 10 was diluted with 16.320 grams of PGMEA. The solution was filtered through 0.1-µm PTFE membrane filter.

Example 12

Trench-Filling Test

The solution in Example 11 was spin-coated at 1,500 rpm for 60 seconds on chips containing trenches of 150 nm wide and 200 nm deep. The chips were baked at 230° C. for 60 seconds. The chips were examined by SEM. The results showed that the trenches were completely filled with a slightly positive bias (20 nm) between the open areas and dense trenches areas.

Example 13

Synthesis of t-BOC-Protected Cyanurate Derivative 1

A solution was made by dissolving 9.45 g of di-tert-butyl dicarbonate and 0.050 grams of pyridine in 25 grams of a 3,7-dihydroxy-2-naphthoic acid-grafted 1,3,5-tris(2,3,-epoxypropyl)isocyanurate (Brewer Science, Rolla, Mo.). The solution was heated at 70° C. under nitrogen with magnetic stirring. The reaction was allowed to proceed at 70° C. for 7 hours. The generated small molecule had the following structure:

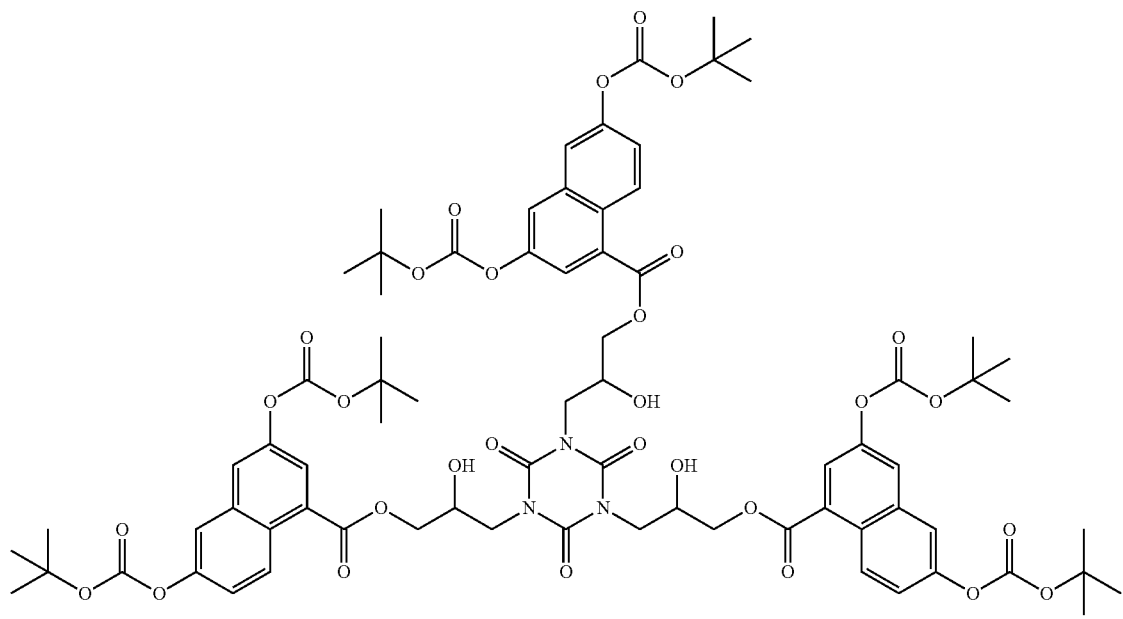 [SMILES: CC(C)(C)OC(=O)Oc1ccc2c(C(=O)OCC(O)Cn3c(=O)n(CC(O)COC(=O)c4cc(OC(=O)OC(C)(C)C)cc5cc(OC(=O)OC(C)(C)C)ccc45)c(=O)n(CC(O)COC(=O)c4cc(OC(=O)OC(C)(C)C)cc5cc(OC(=O)OC(C)(C)C)ccc45)c3=O)cc(OC(=O)OC(C)(C)C)cc2c1]

Example 14

Coating Formulation

In this procedure, 5 grams of the modified cyanurate derivative synthesized in Example 13 was mixed with 0.76 grams of MY721 (N,N,N',N'-tetraglycidyl-4,4'-methylenebisbenzenamine) solution (50% in PGME) in 27.14 grams of PGME/PGMEA (7:3 w/w). The solution was filtered through 0.1-μm PTFE membrane filter.

Example 15

Trench-Filling Test

The solution in Example 14 was spin-coated at 1,500 rpm for 60 seconds on chips containing trenches of 60 nm wide and 200 nm deep. The chips were baked at 205° C. for 60 seconds. The chips were examined by SEM. The results showed that the trenches were completely filled without bias between open areas and dense trenches areas.

Example 16

Synthesis of t-BOC-Protected Cyanurate Derivative 2

A solution was made by dissolving 3.8 grams of di-tert-butyl dicarbonate and 0.015 grams of pyridine in 10 grams of 4-hydroxybenzoic acid- and 4-cyanobenzoic acid-grafted tris(2,3-epoxypropyl)isocyanurate (Brewer Science, Rolla, Mo.). The solution was heated at 70° C. under nitrogen with magnetic stirring. The reaction was allowed to proceed at 70° C. for 7 hours. The generated small molecule had the following structure:

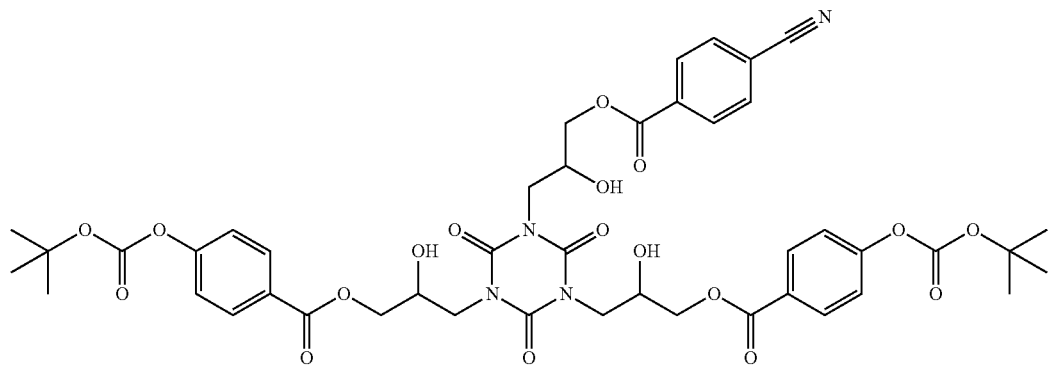 [SMILES: CC(C)(C)OC(=O)Oc1ccc(C(=O)OCC(O)Cn2c(=O)n(CC(O)COC(=O)c3ccc(C#N)cc3)c(=O)n(CC(O)COC(=O)c3ccc(OC(=O)OC(C)(C)C)cc3)c2=O)cc1]

Example 17

Coating Formulation

In this Example, 2.19 grams of the modified cyanurate derivative synthesized in Example 16 was mixed with 0.46 grams of MY721 (N,N,N,N-tetraglycidyl-4,4'-methylene-bisbenzenamine) solution (50% in PGME) in 7.9 grams of PGME/PGMEA (7:3 w/w). The solution was filtered through 0.1-μm PTFE membrane filter.

Example 18

Trench-Filling Test

The solution in Example 17 was spin-coated at 1,500 rpm for 60 seconds on chips containing trenches of 60 nm wide and 200 nm deep. The chips were baked at 205° C. for 60 seconds. The chips were examined by SEM. The results showed that the trenches were completely filled without bias between open areas and dense trenches areas.

Example 19

Synthesis of t-BOC-Protected Polyimide 1

A solution was made by dissolving 0.5 gram of 4,4'-(9-fluorenylidene)dianiline (Sigma Aldrich, St. Louis, Mo.), 0.615 gram of 3-hydroxy-1,8-naphthalic anhydride (TCI America, Portland, Oreg.), 21.13 grams of PGME, and 2 grams of a 4-A molecular sieve (3-5 mm beads, Alfa Aesar, Ward Hill, Mass.) in a 100-mL flask. The solution was heated at 160° C. in a preheated oil bath for 8 hours. The reaction was allowed to cool to 70° C., and 0.60 gram of di-tert-butyl dicarbonate (Alfa Aesar, Ward Hill, Mass.) was added, keeping the reaction at 70° C. for 7 hours. The product was collected after cooling the reaction to room temperature.

Example 20

Coating Formulation

In this procedure, 20 grams of the polyimide synthesized in Example 19 was mixed with 0.4 grams of MY721 (N,N,N',N'-tetraglycidyl-4,4'-methylenebisbenzenamine) solution (50% in PGME) in a 60-ml bottle. The solution was filtered through 0.1-μm PTFE membrane filter.

Example 21

Synthesis of t-BOC-Protected Polyimide 2

A solution was made by dissolving 0.55 gram of 4,4'-(4,4'-isopropylidenedi-phenoxy)bis(phthalic anhydride) (Sigma Aldrich, St. Louis Mo.), 0.5 gram of 2-amino-3-hydroxyanthraquinone (TCI America, Portland Oreg.), 19.76 grams of PGME, and 2 grams of a 4-A molecular sieve in a 100-mL flask. The solution was heated at 160° C. in a preheated oil bath for 8 hours. The reaction was allowed to cool to 70° C., and 0.410 gram of di-tert-butyl dicarbonate was added, keeping the reaction at 70° C. for 7 hours. The product was collected after cooling the reaction to room temperature.

Example 22

Coating Formulation

In this procedure, 20 grams of the polyimide synthesized in Example 21 was mixed with 0.4 grams of MY721 (N,N,N',N'-tetraglycidyl-4,4'-methylenebisbenzenamine) solution (50% in PGME) in a 60-ml bottle. The solution was rotated on a wheel for 1 hour and then filtered through 0.1-μm PTFE membrane filter.

We claim:

1. A method of forming a planarizing layer, said method comprising:
    forming an initial layer of a planarizing composition on a substrate surface, said substrate surface comprising openings formed therein, said planarizing composition comprising a compound dispersed or dissolved in a solvent system, said compound comprising protective groups and said initial layer having an initial positive bias; and
    heating said initial layer, during which said protective groups begin to be removed from said compound to form a deprotected compound and said deprotected compound crosslinks to form a final planarizing layer, said final planarizing layer being formed without a develop-back step after said heating and having a final bias that is less than said initial bias and less than about 30 nm, wherein:
    the initial bias and the final bias are determined by subtracting the average thickness of the initial layer or of the final planarizing layer, respectively, over a dense region from the average thickness of that same layer over an open area region;
a dense region is a portion of a substrate that has at least about 50% of its surface area filled with via holes or a 1:1 line to space ratio; and
an open area region is a portion of a substrate that has less than about 20% of its surface area filled with via holes or a 1:5 line to space ratio.

2. The method of claim 1, wherein said compound is selected from the group consisting of polymers and small molecules.

3. The method of claim 2, wherein said compound is a polymer comprising recurring monomers (I) that comprise said protective groups.

4. The method of claim 3, said polymer further comprising recurring monomers (II).

5. The method of claim 3, said polymer further comprising recurring monomers (III), wherein said recurring monomers (III) comprise functional groups that can crosslink with recurring monomers (I) after said protective groups are removed.

6. The method of claim 5, wherein said recurring monomers (I) comprise respective hydroxy groups that have been protected by said protective groups, said protective groups being removed during said heating to generate deprotected hydroxy groups that crosslink with said recurring monomers (III) during said heating.

7. The method of claim 3, wherein said polymer further comprises recurring monomers (II) and (III).

8. The method of claim 3, wherein said polymer further comprises recurring monomers (II) and said composition further comprises a crosslinking agent.

9. The method of claim 1, wherein said planarizing composition has an initial surface tension, prior to said heating, and wherein said surface tension changes during said heating so as to create a surface tension gradient, said surface tension gradient causing said planarizing composition to flow toward, or toward and onto, said openings.

10. The method of claim 1, wherein said compound has an initial polarity prior to said heating, and during said heating, the formed deprotected compound has a second polarity that is more polar than said initial polarity.

11. The method of claim 1, wherein no additional or separate coating or heating is carried out to form said final planarizing layer, or to form additional planarizing layers.

12. The method of claim 1, wherein at least about 50% of said protective groups are removed after about 30 seconds of heating at a temperature of from about 120° C. to about 260° C.

13. The method of claim 12, wherein said crosslinking does not commence until at least about 5 seconds after said protective group removal commences.

14. The method of claim 1, wherein said crosslinking does not commence until at least about 5 seconds after said protective group removal commences.

15. The method of claim 1, wherein said compound comprises a hydroxy group that has been protected by said protective group.

16. The method of claim 15, wherein said compound is a polymer comprising recurring monomers (I) that comprise a hydroxy group that has been protected by said protective group.

17. The method of claim 15, wherein said protective groups being removed during said heating generate deprotected hydroxy groups.

18. The method of claim 17, wherein said deprotected hydroxy groups are crosslinked during said heating.

19. The method of claim 1, wherein said protective groups are selected from the group consisting of

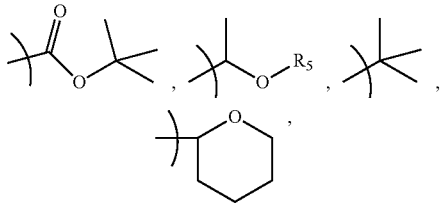

and combinations of the foregoing, where $R_5$ is selected from the group consisting of alkyls.

20. The method of claim 1, wherein said planarizing composition further comprises a crosslinking agent.

21. The method of claim 20, wherein said compound comprises respective hydroxy groups that have been protected by said protective groups, said protective groups being removed during said heating to generate deprotected hydroxy groups that crosslink with said crosslinking agent during said heating.

22. A method of forming a planarizing layer, said method comprising:
forming an initial layer of a planarizing composition on a substrate surface, said substrate surface comprising openings formed therein, said planarizing composition comprising a polymer dispersed or dissolved in a solvent system, said polymer comprising recurring monomers (I) comprising protective groups and said initial layer having an initial bias; and
heating said initial layer, during which said protective groups begin to be removed from said recurring monomers (I) to form deprotected recurring monomers (I) that crosslink to form a final planarizing layer, said final planarizing layer having a final bias and being formed without a develop-back step after said heating, said final bias being less than said initial bias and less than about 30 nm, wherein:
the initial bias and the final bias are determined by subtracting the average thickness of the initial layer or of the final planarizing layer, respectively, over a dense region from the average thickness of that same layer over an open area region;
a dense region is a portion of a substrate that has at least about 50% of its surface area filled with via holes or a 1:1 line to space ratio; and
an open area region is a portion of a substrate that has less than about 20% of its surface area filled with via holes or a 1:5 line to space ratio.

23. The method of claim 22, wherein said planarizing composition has an initial surface tension, prior to said heating, and wherein said surface tension changes during said heating so as to create a surface tension gradient, said surface tension gradient causing said planarizing composition to flow toward, or toward and onto, said openings.

24. The method of claim 22, wherein said recurring monomers (I) have an initial polarity prior to said heating, and during said heating, the deprotected recurring monomers (I) have a second polarity that is more polar than said initial polarity.

25. The method of claim 22, wherein no additional or separate coating or heating is carried out to form said final planarizing layer, or to form additional planarizing layers.

26. The method of claim 22, wherein at least about 50% of said protective groups are removed after about 30 seconds of heating at a temperature of from about 120° C. to about 260° C.

27. The method of claim 22, wherein said crosslinking does not commence until at least about 5 seconds after said protective group removal commences.

28. The method of claim 22, wherein said recurring monomers (I) comprise a hydroxy group that has been protected by said protective group.

29. The method of claim 28, wherein said protective groups being removed during said heating generates deprotected hydroxy groups.

30. The method of claim 29, wherein said deprotected hydroxy groups are crosslinked during said heating.

31. The method of claim 22, said polymer further comprising recurring monomers (II).

32. The method of claim 22, said polymer further comprising recurring monomers (III), wherein said recurring monomers (III) comprise functional groups that can crosslink with recurring monomers (I) after said protective groups are removed.

33. The method of claim 32, wherein said recurring monomers (I) comprise respective hydroxy groups that have been protected by said protective groups, said protective groups being removed during said heating to generate deprotected hydroxy groups that crosslink with said recurring monomers (III) during said heating.

34. The method of claim 22, wherein said planarizing composition further comprises a crosslinking agent.

35. The method of claim 34, wherein said recurring monomers (I) comprise respective hydroxy groups that have been protected by said protective groups, said protective groups being removed during said heating to generate deprotected hydroxy groups that crosslink with said crosslinking agent during said heating.

\* \* \* \* \*